United States Patent
Yiu et al.

(10) Patent No.: US 9,935,148 B2
(45) Date of Patent: Apr. 3, 2018

(54) METHOD FOR FORMING CHIP PACKAGE HAVING CHIP CONNECTED TO SENSING DEVICE WITH REDISTRIBUTION LAYER IN INSULATOR LAYER

(71) Applicant: XINTEC INC., Taoyuan (TW)

(72) Inventors: Ho-Yin Yiu, Kln (HK); Ying-Nan Wen, Hsinchu (TW); Chien-Hung Liu, New Taipei (TW); Wei-Chung Yang, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/181,291

(22) Filed: Jun. 13, 2016

(65) Prior Publication Data

US 2017/0018590 A1   Jan. 19, 2017

Related U.S. Application Data

(60) Provisional application No. 62/191,729, filed on Jul. 13, 2015.

(51) Int. Cl.
*H01L 27/146* (2006.01)

(52) U.S. Cl.
CPC .... *H01L 27/14634* (2013.01); *H01L 27/1469* (2013.01); *H01L 27/14618* (2013.01); *H01L 27/14627* (2013.01); *H01L 27/14636* (2013.01); *H01L 2224/18* (2013.01)

(58) Field of Classification Search
None
See application file for complete search history.

(56) References Cited

U.S. PATENT DOCUMENTS

| | | | | |
|---|---|---|---|---|
| 8,772,932 B2* | 7/2014 | Chen | ............ | H01L 23/5389 257/692 |
| 2008/0191297 A1* | 8/2008 | Yang | ............ | H01L 27/14618 257/432 |
| 2010/0032830 A1* | 2/2010 | Chang | ............ | H01L 21/76898 257/737 |
| 2011/0068427 A1 | 3/2011 | Paek et al. | | |
| 2011/0180891 A1* | 7/2011 | Lin | ............ | H01L 21/6835 257/432 |
| 2011/0193225 A1* | 8/2011 | Chen | ............ | H01L 24/82 257/737 |
| 2013/0164867 A1* | 6/2013 | Ramasamy | ............ | H01L 27/14618 438/25 |

(Continued)

*Primary Examiner* — Michael Jung
(74) *Attorney, Agent, or Firm* — Liu & Liu

(57) ABSTRACT

A chip package is provided. The chip package includes a sensing device. The chip package also includes a first conductive structure disposed on the sensing device and electrically connected to the sensing device. The chip package further includes a chip and a second conductive structure disposed on the sensing device. The chip includes an integrated circuit device. The second conductive structure is positioned on the chip and is electrically connected to the integrated circuit device and the first conductive structure. In addition, the chip package includes an insulating layer covering the sensing device and the chip. The insulating layer has a hole. The first conductive structure is positioned under the bottom of the hole. The top surface of the insulating layer is coplanar with the top surface of the second conductive structure. A method for forming the chip package is also provided.

20 Claims, 14 Drawing Sheets

(56) References Cited

U.S. PATENT DOCUMENTS

| | | | |
|---|---|---|---|
| 2013/0313727 A1* | 11/2013 | Goh | H01L 21/50 257/777 |
| 2013/0320463 A1* | 12/2013 | Chang | H01L 24/97 257/415 |
| 2015/0145094 A1* | 5/2015 | Liu | H01L 25/50 257/459 |
| 2015/0145108 A1* | 5/2015 | Yap | H01L 21/768 257/664 |
| 2015/0166329 A1* | 6/2015 | Cheng | B81B 7/007 257/417 |
| 2016/0046483 A1* | 2/2016 | Cheng | B81B 7/008 257/692 |

\* cited by examiner

METHOD FOR FORMING CHIP PACKAGE HAVING CHIP CONNECTED TO SENSING DEVICE WITH REDISTRIBUTION LAYER IN INSULATOR LAYER

CROSS REFERENCE TO RELATED APPLICATIONS

This application claims priority of U.S. Provisional Application No. 62/191,729, filed Jul. 13, 2015, the entirety of which is incorporated by reference herein.

BACKGROUND OF THE INVENTION

Field of the Invention

The invention relates to chip package technology, and in particular to a chip package and methods for forming the same.

Description of the Related Art

The chip packaging process is an important step in the fabrication of electronic products. Chip packages not only protect the chips therein from outer environmental contaminants, but they also provide electrical connection paths between electronic elements inside and those outside of the chip packages.

There are differences between development of sensing chips and integrated circuit chips. Under consideration for fabrication cost, chip packages having sensing functions and other integrated circuit chips are separately and independently disposed on a printed circuit board and are electrically connected to each other through wires.

However, the size of the printed circuit board is limited in this fabrication process. As a result, it is difficult to further decrease the size of the electronic products made therefrom.

Thus, there exists a need in the art for development of a chip package and methods for forming the same capable of mitigating or eliminating the aforementioned problems.

BRIEF SUMMARY OF THE INVENTION

An embodiment of the invention provides a chip package. The chip package includes a sensing device. The chip package also includes a first conductive structure disposed on the sensing device and electrically connected to the sensing device. The chip package further includes a chip and a second conductive structure disposed on the sensing device. The chip includes an integrated circuit device. The second conductive structure is positioned on the chip and is electrically connected to the integrated circuit device and the first conductive structure. In addition, the chip package includes an insulating layer covering the sensing device and the chip. The insulating layer has a hole. The first conductive structure is positioned under the bottom of the hole. The top surface of the insulating layer is coplanar with the top surface of the second conductive structure.

An embodiment of the invention provides a method for forming a chip package. The method includes forming a first conductive structure on a sensing device. The first conductive structure is electrically connected to the sensing device. The method also includes providing a chip and a second conductive structure on the sensing device. The chip includes an integrated circuit device. The second conductive structure is positioned on the chip and is electrically connected to the integrated circuit device and the first conductive structure. The method further includes forming an insulating layer to cover the sensing device and the chip. The insulating layer has a hole. The first conductive structure is positioned under the bottom of the hole. The top surface of the insulating layer is coplanar with the top surface of the second conductive structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint-recognition devices, microactuators, surface acoustic wave devices, pressure sensors, ink printer heads, and so on.

The aforementioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the aforementioned wafer-level packaging process may also be adapted to form a chip package having multilayer integrated circuit devices by stacking a plurality of wafers having integrated circuits or to form a system-in-package (SIP).

Figure 1A:
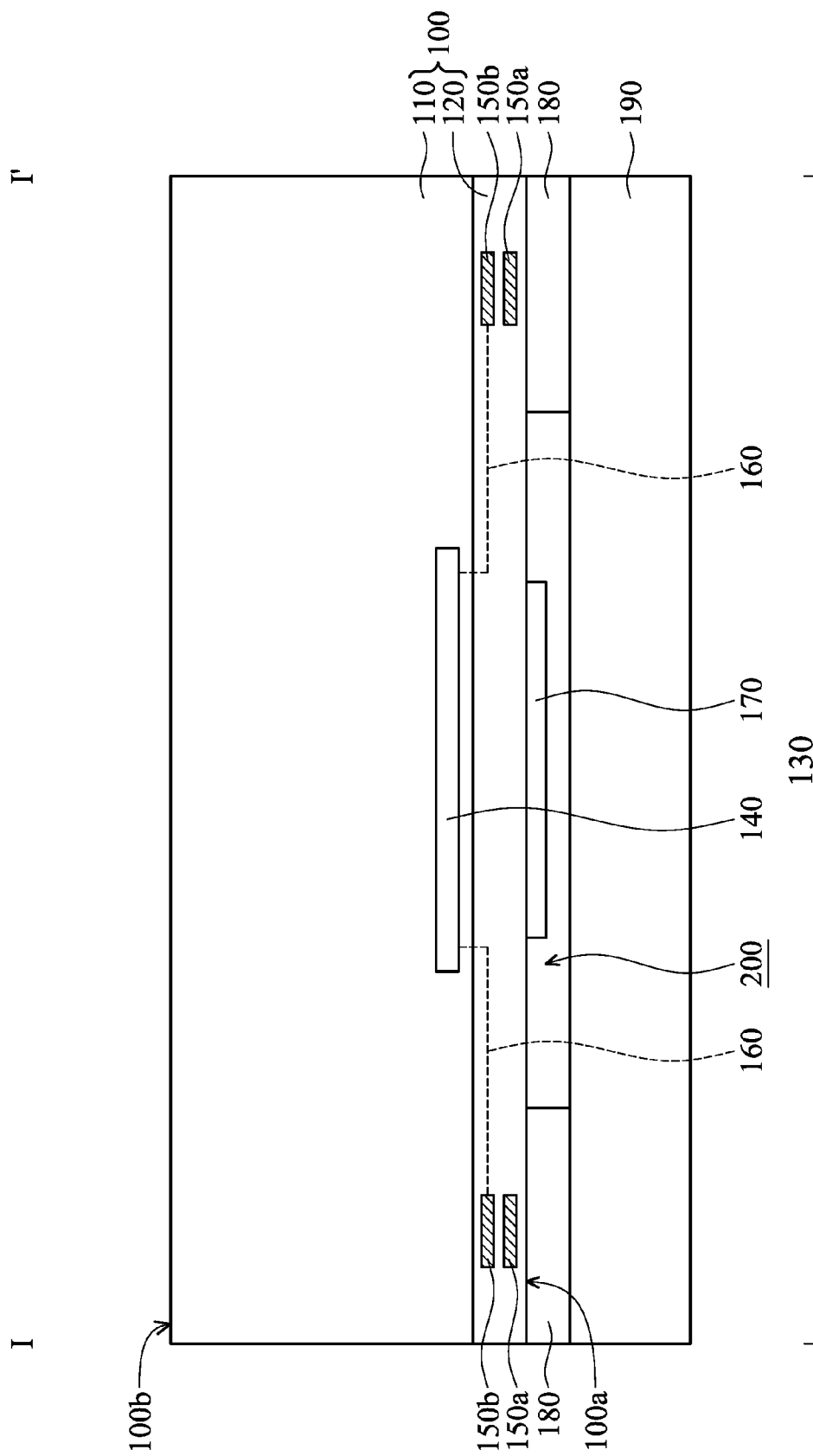
FIGS. 1A to 1F are cross-sectional views of an exemplary embodiment of a method for forming a chip package according to the invention.
Figure 1B:
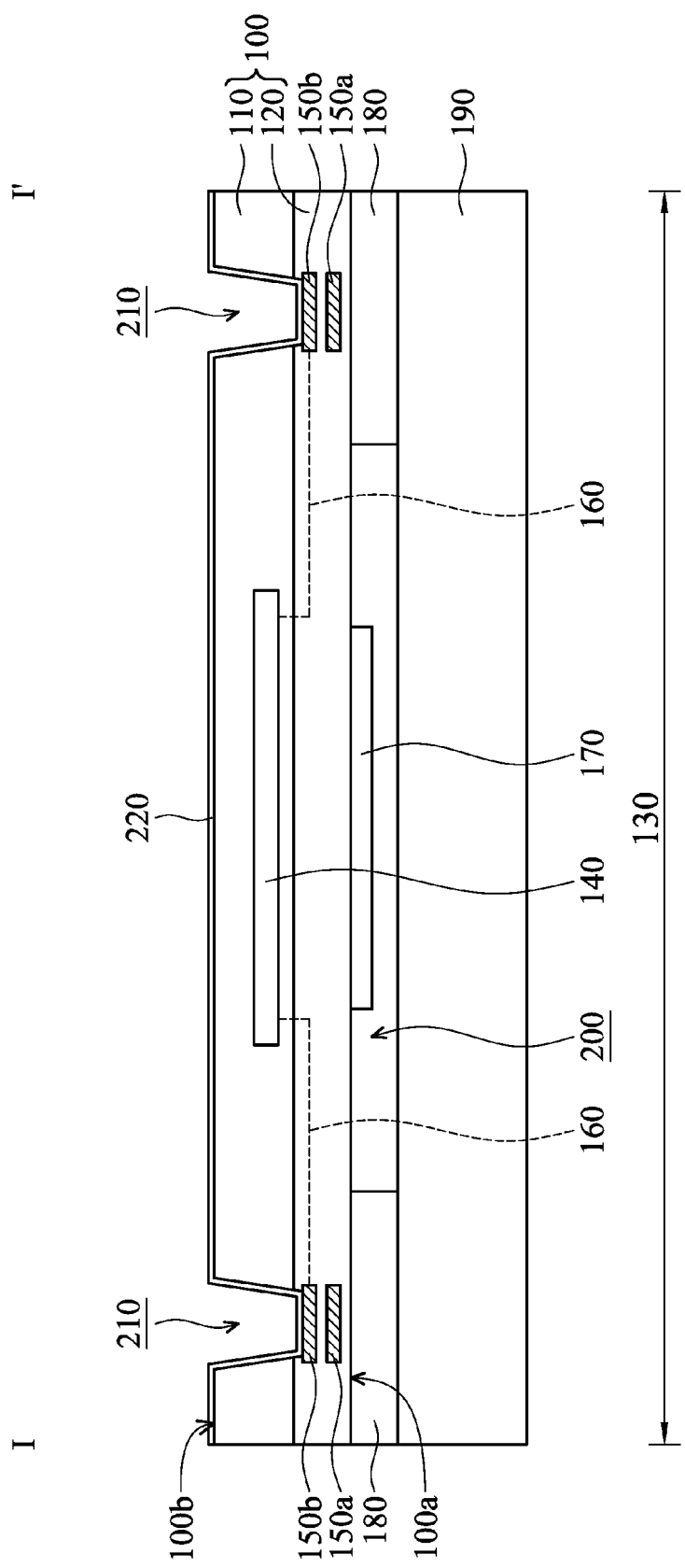
Figure 1C:
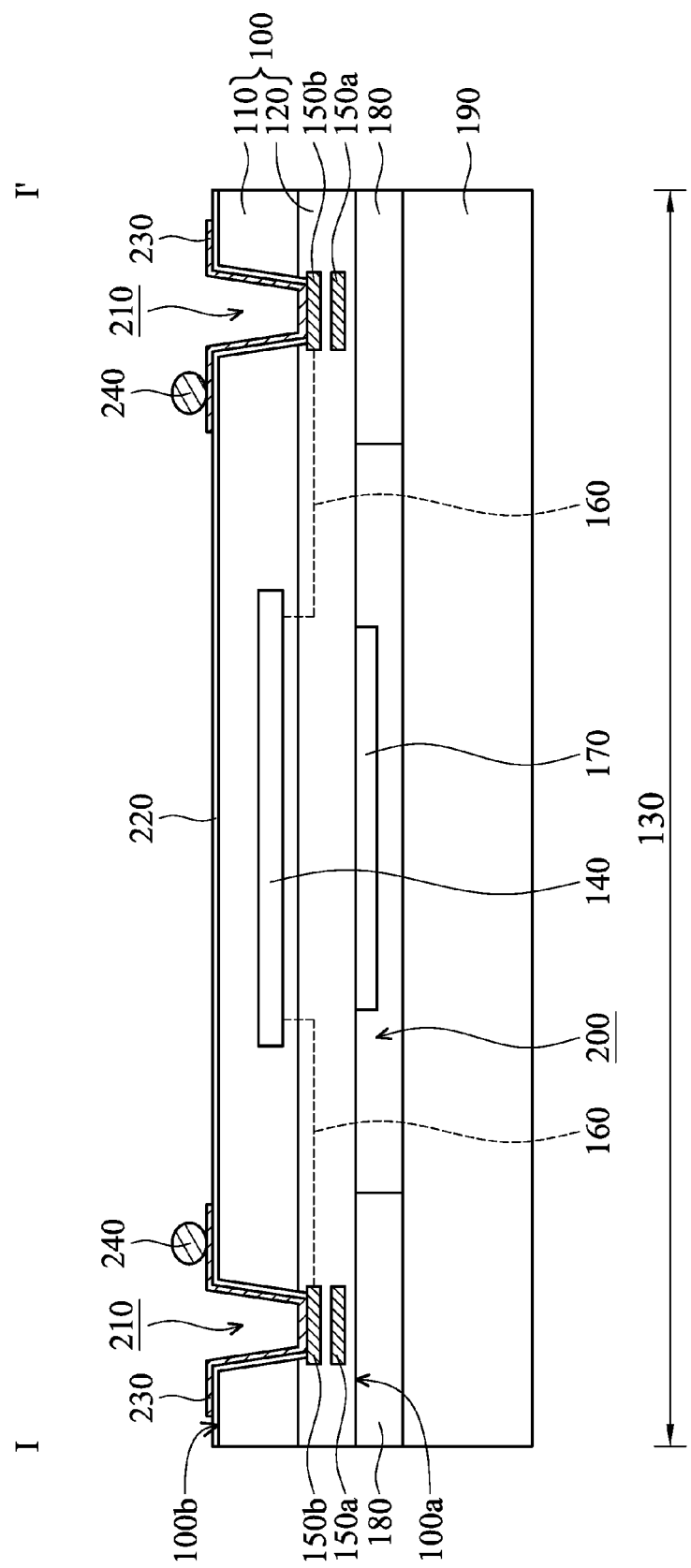
Figure 1D:
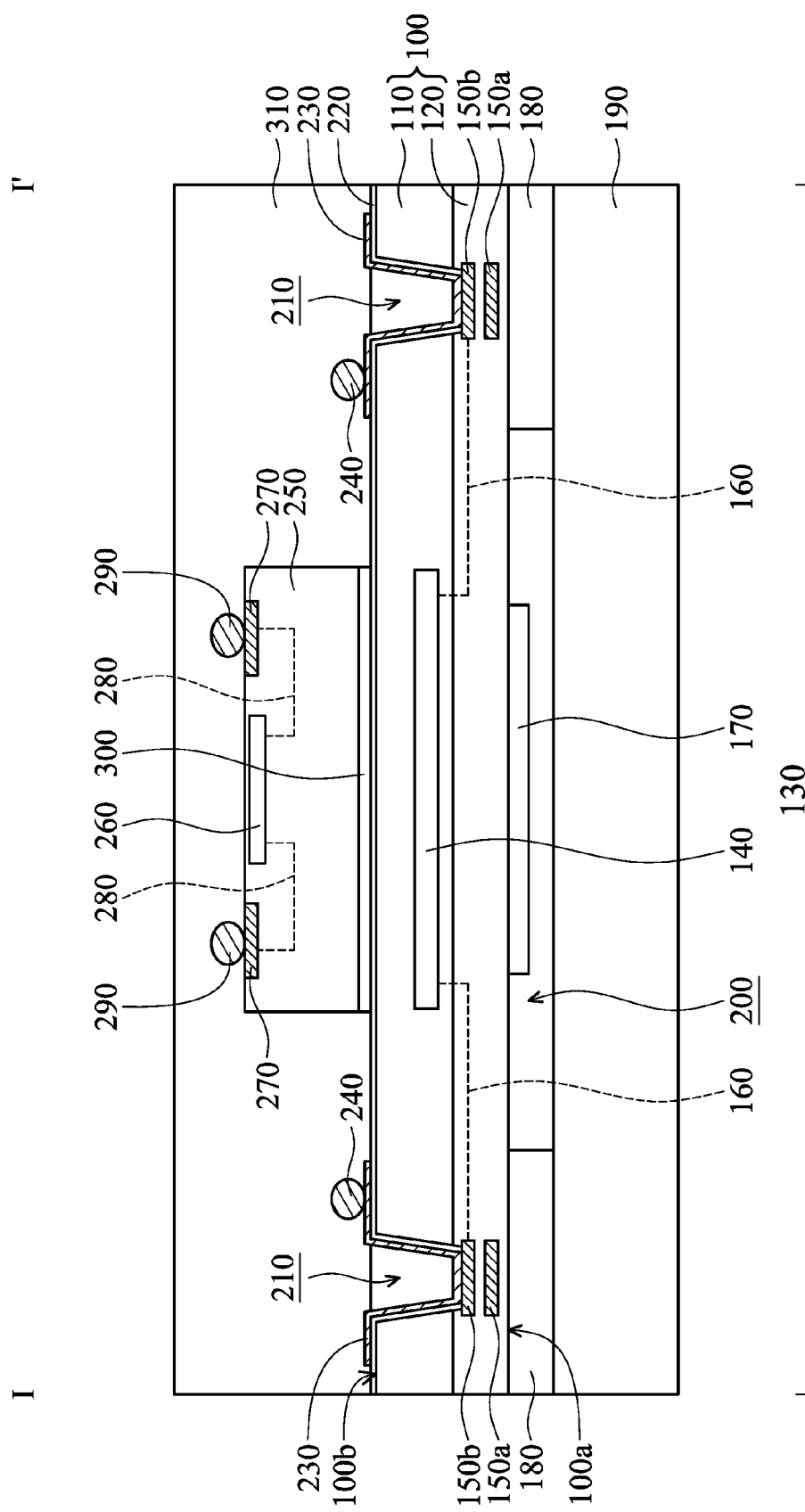
Figure 1E:
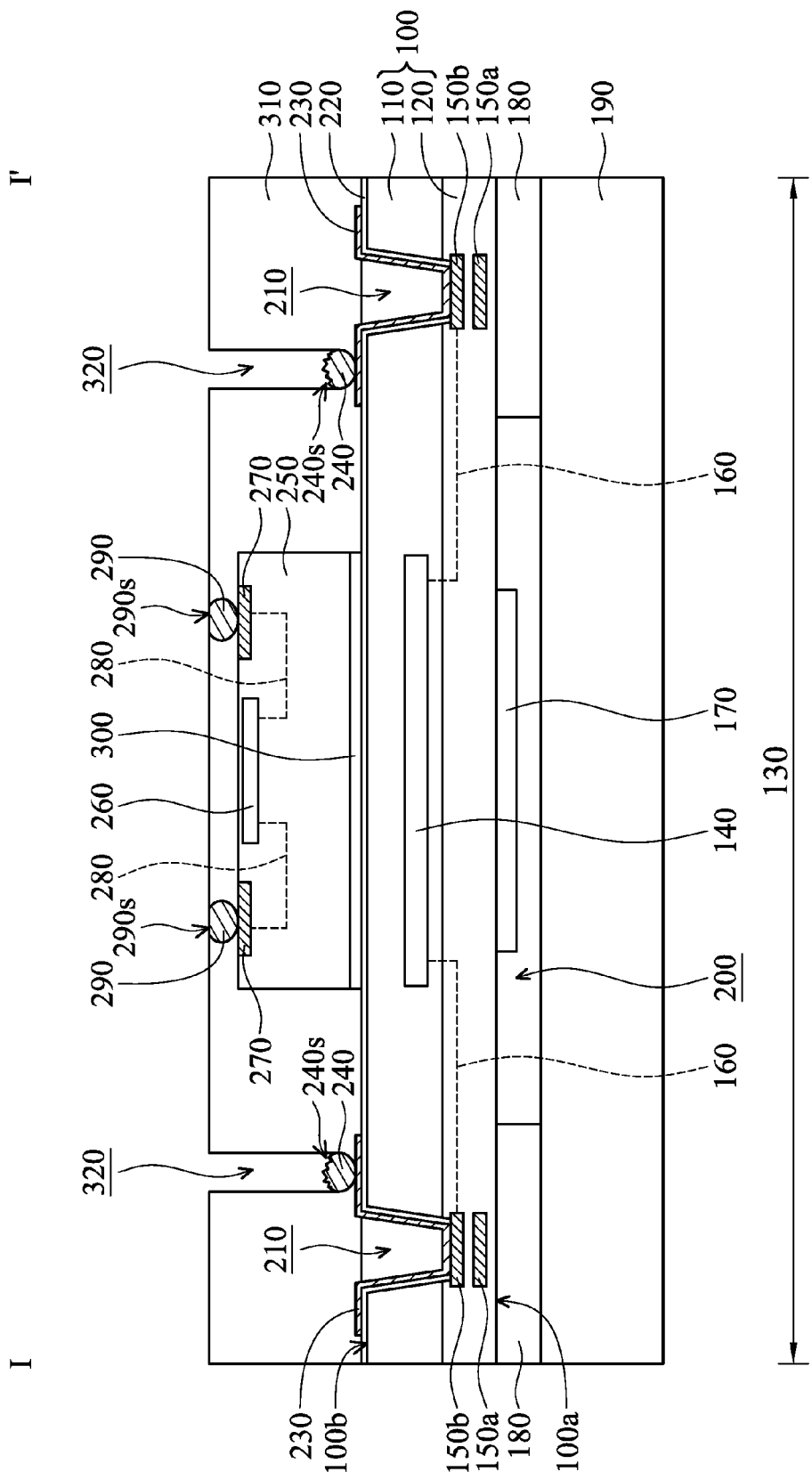
Figure 1F:
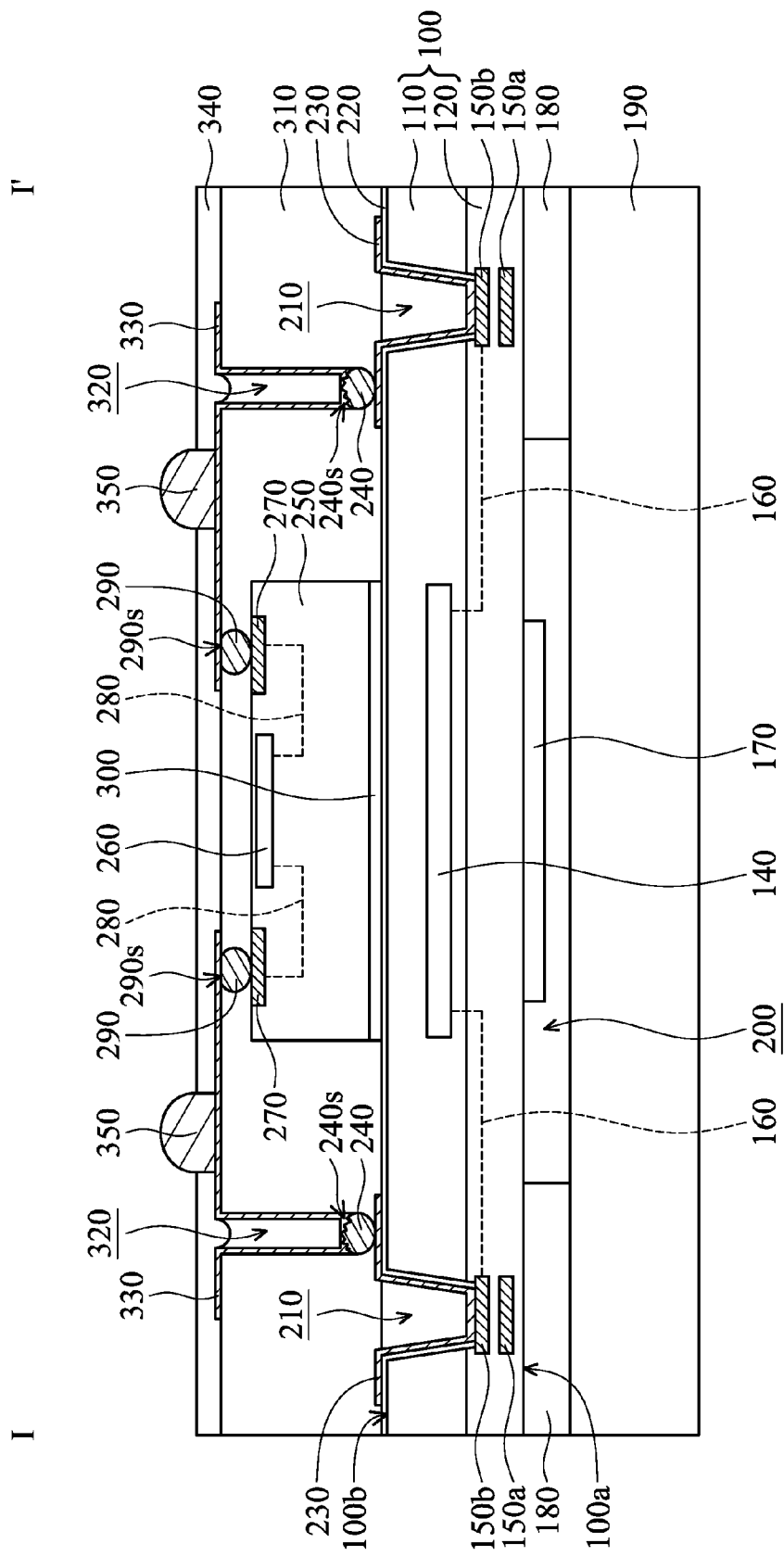
Figure 2:
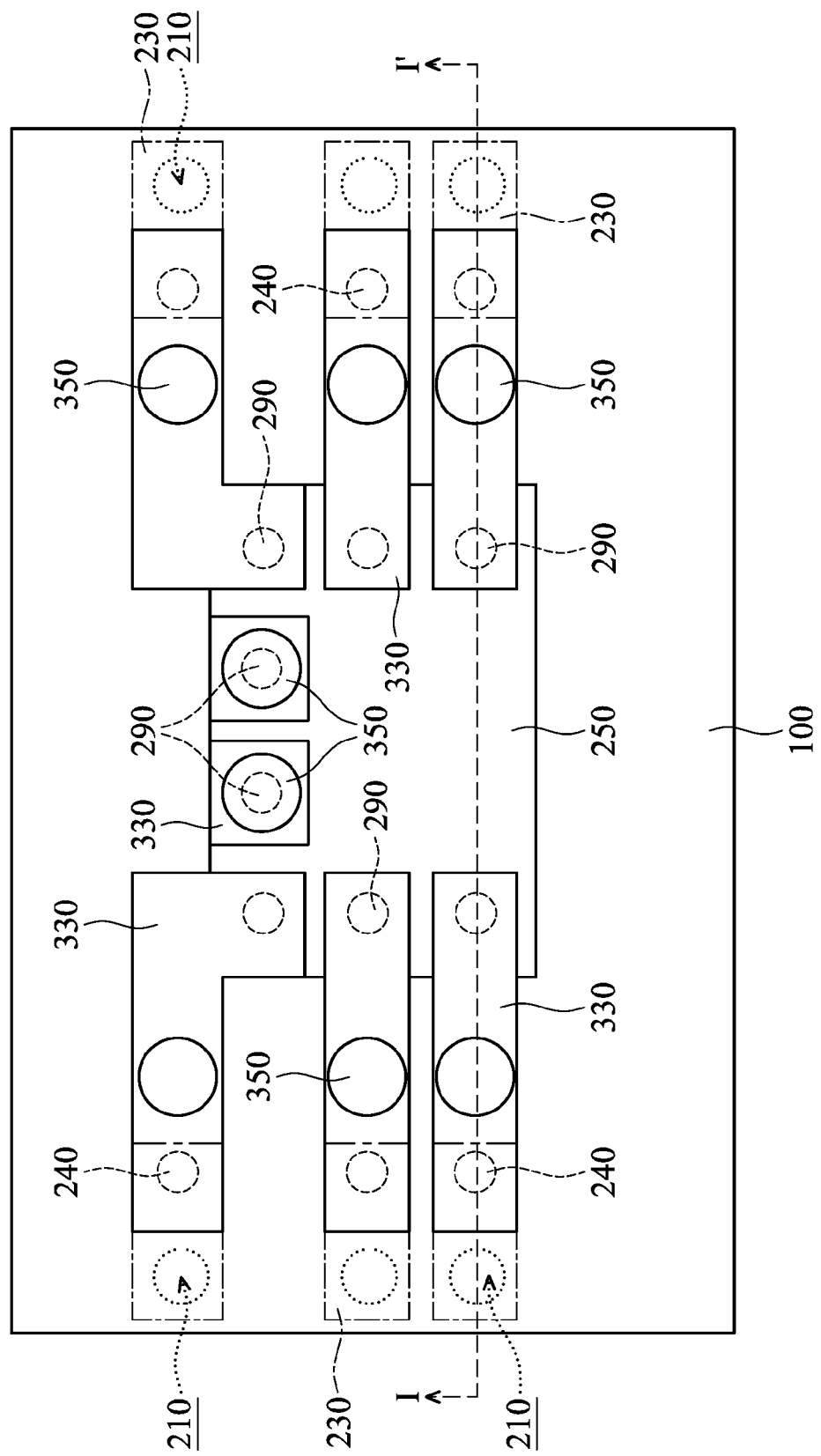
FIG. 2 is a top view of an exemplary embodiment of a chip package according to the invention.

An exemplary embodiment of a method for forming a chip package according to the invention is illustrated in FIGS. 1A to 1F and FIG. 2, in which FIGS. 1A to 1F are cross-sectional views of an exemplary embodiment of a method for forming a chip package according to the invention, and FIG. 2 is a top view of an exemplary embodiment of a chip package according to the invention.

Referring to FIG. 1A, a substrate 100 is provided. The substrate 100 has a first surface 100a and a second surface 100b opposite thereto. The substrate 100 is composed of a semiconductor substrate 110 and an insulating layer 120 adjoining thereto. The semiconductor substrate 110 is adjacent to the second surface 100b, and may be a silicon substrate or another semiconductor substrate. For example, the semiconductor substrate 110 may be a silicon wafer so as to facilitate the wafer-level packaging process.

The insulating layer 120 is adjacent to the first surface 100a, and may be made of an interlayer dielectric (ILD) layer, inter-metal dielectric (IMD) layers and a covering passivation layer. To simplify the diagram, only a single insulating layer 120 is depicted herein. In the embodiment, the insulating layer 120 may comprise an inorganic material, such as silicon oxide, silicon nitride, silicon oxynitride, metal oxide, a combination thereof, or another suitable insulating material.

In some embodiments, the substrate 100 comprises multiple chip regions 130. To simplify the diagram, only a single chip region 130 is depicted herein. There is a sensing device 140 in the semiconductor substrate 110 in each chip region 130. The sensing device 140 may be adjacent to an interface between the semiconductor substrate 110 and the insulating layer 120.

In some embodiments, the sensing device 140 comprises an image sensing element, such as a complementary metal-oxide-semiconductor image sensing (CIS) element. In some other embodiments, the sensing device 140 is configured to sense biometrics (for example, the sensing device 140 may comprise a fingerprint-recognition element) or is configured to sense environmental characteristics (for example, the sensing device 140 may comprise a temperature-sensing element, a humidity-sensing element, a pressure-sensing element, a capacitance-sensing element, or another suitable sensing element).

There is one or more conducting pads in the insulating layer 120 in each chip region 130. The conducting pads may be a single conducting layer or comprise multiple conducting layers. To simplify the diagram, only a topmost conducting pad 150a and a bottommost conducting pad 150b, which are vertically stacked, are depicted herein as an example. In some other examples, there are one or more intermediate conducting pads and one or more vias between the topmost conducting pad 150a and the bottommost conducting pad 150b. In some embodiments, the topmost conducting pad 150a and the bottommost conducting pad 150b may comprise copper, aluminum, or another suitable conductive material.

The topmost conducting pad 150a and the bottommost conducting pad 150b may be electrically connected to the sensing device 140 in the semiconductor substrate 110 through interconnection structures in the insulating layer 120. To simplify the diagram, dotted lines 160 are used herein to depict interconnection structures between the sensing device 140 and the bottommost conducting pad 150b.

In some embodiments, an optical element 170 may be formed on the first surface 100a of the substrate 100 by coating, exposing, and developing processes. The optical element 170 corresponds to the sensing device 140. In some embodiments, the optical element 170 may comprise a filter layer and a micro-lens array, or another suitable optical element used for an image sensing device.

Afterwards, a cover plate 190 is attached on the first surface 100a of the substrate 100 through a spacer layer (or dam) 180. A cavity 200 is surrounded by the spacer layer 180, the cover plate 190, and the substrate 100. As a result, the optical element 170 is located in the cavity 200.

In an embodiment, the spacer layer 180 does not substantially absorb moisture. In an embodiment, the spacer layer 180 may be non-adhesive, and thus the spacer layer 180 may contact additional adhesive glue. In another embodiment, the spacer layer 180 may be adhesive itself and may contact none of the adhesive glue, thereby assuring that the spacer layer 180 will not move due to disposition of the adhesive glue. Furthermore, since adhesive glue is not needed, contamination due to overflow of the adhesive glue can be prevented. In the embodiment, the spacer layer 180 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates), a photoresist material or another suitable insulating material. Moreover, the cover plate 190 may comprise glass, sapphire or another suitable protective material.

Referring to FIG. 1B, a thinning process (such as an etching process, a milling process, a mechanical grinding process or a chemical polishing process) using the cover plate 190 as a carrier substrate is performed on the second surface 100b of the substrate 100. As a result, the thickness of the substrate 100 is reduced.

Afterwards, multiple openings 210 may be formed in the substrate 100 in each chip region 130 by a lithography process and an etching process (such as a dry etching process, a wet etching process, a plasma etching process, a reactive ion etching process, or another suitable process). The openings 210 extend from the second surface 100b of the substrate 100 towards the first surface 100a. The openings 210 penetrate through the semiconductor substrate 110 and extend into the insulating layer 120 to expose the top surface of the bottommost conducting pad 150b.

Next, an insulating layer 220 may be formed on the second surface 100b of the substrate 100 by a deposition process (such as a coating process, a physical vapor deposition process, a chemical vapor deposition process or another suitable process). The insulating layer 220 conformally extends into the openings 210, and covers the exposed bottommost conducting pad 150b. In some embodiments, the insulating layer 220 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

Referring to FIG. 1C, portions of the insulating layer 220 on the bottoms of the openings 210 are removed by a lithography process and an etching process (such as a dry etching process, a wet etching process, a plasma etching process, a reactive ion etching process, or another suitable process). As a result, the top surface of the bottommost conducting pad 150*b* is exposed.

A patterned redistribution layer (RDL) 230 may be formed on the insulating layer 220 by a deposition process (such as a coating process, a physical vapor deposition process, a chemical vapor deposition process, an electroplating process, an electroless plating process or another suitable process) and lithography and etching processes. The redistribution layer 230 is on the second surface 100*b* and conformally extends onto sidewalls and bottoms of the openings 210.

The redistribution layer 230 is electrically isolated from the semiconductor substrate 110 by the insulating layer 220. The redistribution layer 230 may be in direct electrical contact with or indirectly electrically connected to the exposed bottommost conducting pad 150*b* through the openings 210. As a result, the redistribution layer 230 in the openings 210 is also referred to as a through silicon via (TSV). In some embodiments, the redistribution layer 230 may comprise aluminum, copper, gold, platinum, nickel, tin, a combination thereof, a conductive polymer material, a conductive ceramic material (such as indium tin oxide or indium zinc oxide), or another suitable conductive material.

Afterwards, multiple first conductive structures 240 are correspondingly formed on the redistribution layer 230 on the second surface 100*b*. In some embodiments, the first conductive structures 240 are formed by a wire bonding process. In this case, the first conductive structures 240 are balls (such as bonding balls), and the first conductive structures 240 may comprise gold or another suitable conductive material.

In some other embodiments, an insulating layer is previously formed on the redistribution layer 230. The insulating layer has openings exposing the redistribution layer 230. An electroless plating process, a lithography process, and an etching process may be sequentially performed. As a result, the first conductive structures 240 are formed in the openings of the insulating layer. In this case, the first conductive structures 240 are pillars (such as conducting pillars), and the first conductive structures 240 may comprise copper or another suitable conductive material.

Referring to FIG. 1D, a chip 250 is provided on the second surface 100*b* of the substrate 100. There are multiple second conductive structures 290 on the top surface of the chip 250. The chip 250 with the second conductive structures 290 is attached on the insulating layer 220 by an adhesive layer (such as adhesive glue) 300.

In some embodiments, the chip 250 comprises an integrated circuit device 260. Moreover, the integrated circuit device 260 may comprise a signal processing device (such as an image signal processing (ISP) device) or another application-specific integrated circuit (ASIC) device.

There is one or more conducting pads in the chip 250 and adjacent to the top surface of the chip 250. The second conductive structures 290 are positioned on the corresponding conducting pads. To simplify the diagram, only two conducting pads 270 in the chip 250 are depicted herein. In some embodiments, the conducting pads 270 may be a single conducting layer or comprise multiple conducting layers. Only a single conducting layer is depicted herein as an example. In some embodiments, the conducting pads 270 may be electrically connected to the integrated circuit device 260 through interconnection structures (as shown by dotted lines 280) in the chip 250.

In some embodiments, a wafer with the integrated circuit device 260 and the conducting pads 270 may be previously provided. The second conductive structures 290 are then formed on the conducting pads 270 of the wafer. A thinning process and a dicing process are sequentially performed on the wafer to form the chip 250. Afterwards, the chip 250 with the second conductive structures 290 is attached onto the second surface 100*b*. As a result, the formation of the second conductive structures 290 is not only easier, but the chip 250 can also be prevented from being cracked. More specifically, the thickness of the chip 250 is much less than that of the wafer. If the second conductive structures 290 are formed after the chip 250 is attached onto the second surface 100*b*, the chip 250 would be cracked during the formation of the second conductive structures 290 due to low thickness and insufficient support.

In some embodiments, a wire bonding process may be performed on the wafer to form the second conductive structures 290 on the conducting pads 270. In this case, the second conductive structures 290 are balls and may comprise gold or another suitable conductive material. In some other embodiments, an electroless plating process, a lithography process, and an etching process may be sequentially performed on the wafer to form the second conductive structures 290. In this case, the second conductive structures 290 are pillars and may comprise copper or another suitable conductive material.

In some embodiments, the material of the second conductive structures 290 may be the same as or different from that of the first conductive structures 240. The process for forming the second conductive structures 290 may be the same as or different from that for forming the first conductive structures 240.

In some embodiments, the size of the substrate 100 is larger than that of the chip 250. Moreover, when the size of the substrate 100 is large enough, more than one chip 250 with different integrated circuit functions can be disposed on the second surface 100*b* of the substrate 100. In some embodiments, the chip 250 completely vertically overlaps the sensing device 140 of the substrate 100. In some other embodiments, the chip 250 may be partially vertically overlap the sensing device 140 of the substrate 100 or not vertically overlap the sensing device 140 of the substrate 100.

After the chip 250 with the second conductive structures 290 is attached on the insulating layer 220, an insulating layer 310 may be formed on the second surface 100*b* of the substrate 100 by a molding process or a deposition process (such as a coating process, a physical vapor deposition process, a chemical vapor deposition process or another suitable process). The insulating layer 310 covers the substrate 100, the first conductive structures 240, the redistribution layer 230, the chip 250 and the second conductive structures 290.

In some embodiments, the insulating layer 310 does not fill into the openings 210 of the substrate 100. In some other embodiments, the openings 210 of the substrate 100 may be partially or completely filled with the insulating layer 310. In some embodiments, the insulating layer 310 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

Referring to FIG. 1E, a grinding process (such as a mechanical grinding process or a chemical polishing process) is performed on the top surface of the insulating layer 310 until the second conductive structures 290, which is previously covered by the insulating layer 310, is exposed. During the grinding process, the thickness of the insulating layer 310 is reduced, and the top surface of the second conductive structures 290 is also partially ground. As a result, the top surface of the insulating layer 310 is coplanar with the top surface of the second conductive structures 290. In some embodiments, the second conductive structures 290 are balls. Before the grinding process, the top surface of the second conductive structures 290 is not flat. After the grinding process, a portion of the top surface of the second conductive structures 290 becomes a flat top surface 290s, as shown in FIG. 1E. In some other embodiments, the second conductive structures 290 are pillars. Before and after the grinding process, the top surface of the second conductive structures 290 remains flat.

Afterwards, multiple holes 320 may be formed in the ground insulating layer 310 by a laser drilling process or another suitable process. As a result, the first conductive structures 240 are correspondingly exposed by the holes 320. During the formation of the holes 320, the first conductive structures 240 are used as a buffer layer, such as a laser stopper. Accordingly, the first conductive structures 240 are positioned under the bottom of the holes 320. In other words, the bottom surfaces of the holes 320 may be the top surfaces of the first conductive structures 240. Also, the bottom surfaces of the first conductive structures 240 are under the bottom surfaces of the holes 320. Therefore, the redistribution layer 230 can be prevented from being damaged during the formation of the holes 320 by the first conductive structures 240. Reliability and quality of the chip package can be improved.

Moreover, the ground insulating layer 310 has lowered thickness, and there are the first conductive structures 240 on the redistribution layer 230. As a result, the aspect ratio (AR) of the holes 320 is greatly reduced, which helps the formation of the holes 320.

In some embodiments, before the formation of the holes 320, the first conductive structures 240 have a substantially even and smooth top surface. After the formation of the holes 320, the top surfaces of the first conductive structures 240, which provide a buffer, become an uneven top surface 240s, as shown in FIG. 1E.

Referring to FIG. 1F, it is a cross-sectional view taken along line I-I' shown in FIG. 2. A patterned redistribution layer 330 may be formed on the insulating layer 310 by a deposition process (such as a coating process, a physical vapor deposition process, a chemical vapor deposition process, an electroplating process, an electroless plating process or another suitable process) and lithography and etching processes. The redistribution layer 330 on the insulating layer 310 may be in direct electrical contact with or indirectly electrically connected to the exposed second conductive structures 290. The redistribution layer 330 further conformally extends onto sidewalls and bottoms of the holes 320. The redistribution layer 330 may be in direct electrical contact with or indirectly electrically connected to the exposed first conductive structures 240 through the holes 320. In some other embodiments, the holes 320 of the insulating layer 310 may be completely filled with the redistribution layer 330. In some embodiments, the redistribution layer 330 may comprise copper, aluminum, gold, platinum, nickel, tin, a combination thereof, a conductive polymer material, a conductive ceramic material (such as indium tin oxide or indium zinc oxide), or another suitable conductive material.

Next, a protection layer 340 may be formed on the redistribution layer 330 and the insulating layer 310 by a deposition process (such as a coating process, a physical vapor deposition process, a chemical vapor deposition process or another suitable process). In some embodiments, a portion of the protection layer 340 fills the holes 320, and a gap or cavity is formed between the redistribution layer 330 in the holes 320 and the protection layer 340 in the holes 320. In some other embodiments, the holes 320 may be completely filled with the redistribution layer 330 and the protection layer 340. In some embodiments, the protection layer 340 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), a photoresist material or another suitable insulating material.

Afterwards, multiple openings may be formed in the protection layer 340 in each chip region 130 by lithography and etching processes so as to expose portions of the redistribution layer 330 on the insulating layer 310. In some embodiments, the protection layer 340 may comprise a photoresist material, and the openings may be formed in the protection layer 340 by a lithography process.

Subsequently, multiple third conductive structures 350 may be formed in the openings of the protection layer 340 to be in direct electrical contact with or indirectly electrically connected to the exposed redistribution layer 330. In some embodiments, the third conductive structures 350 may be bumps (such as bonding balls or conductive pillars) or another suitable conductive structure. For example, solder may be formed in the openings of the protection layer 340 by an electroless plating process, a screen printing process or another suitable process. A reflow process is then performed, and solder balls are formed to be the third conductive structures 350. In some embodiments, the third conductive structures 350 may comprise tin, lead, copper, gold, nickel, a combination thereof or another suitable conductive material.

In some embodiments, the size of the third conductive structures 350 is greater than that of the first conductive structures 240 and/or the second conductive structures 290. In some embodiments, the material of the third conductive structures 350 is different from that of the first conductive structures 240 and/or the second conductive structures 290. In some embodiments, the process for forming the third conductive structures 350 is different from the process for forming the first conductive structures 240 and/or the second conductive structures 290. For example, the third conductive structures 350 are formed by a reflow process while the first conductive structures 240 and/or the second conductive structures 290 are formed by a wire bonding process or a plating process.

According to the embodiments, the material of the first conductive structures 240 and the second conductive structures 290 (such as gold) can be bonded to the material of the redistribution layers 230 and 330 (such as aluminum) by an eutectic bonding method. As a result, the first conductive structures 240 and the second conductive structures 290 can be directly formed on the redistribution layers 230 and 330, respectively. There is no need to perform an additional surface treatment on the redistribution layers 230 and 330. For example, there is no additional conductive layer (such as a nickel layer) formed on the redistribution layers 230 and 330. Furthermore, since the first conductive structures 240 and the second conductive structures 290 are formed by wire bonding processes, rather than reflow processes, the fabrication flow is simplified.

In some embodiments, some of the third conductive structures 350 do not vertically overlap the chip 250. One of the third conductive structures 350 is located laterally between one of the first conductive structures 240 and one of the second conductive structures 290, as shown in FIG. 1F and FIG. 2. Furthermore, some of the third conductive structures 350 may be disposed directly above the second conductive structures 290. As a result, they vertically overlap some of the second conductive structures 290 and the chip 250. Also, a portion of the redistribution layer 330 is vertically sandwiched between one of the second conductive structures 290 and one of the third conductive structures 350, as shown in FIG. 2.

In some embodiments, the size of the openings 210 is greater than that of the first conductive structures 240 and the holes 320. It should be realized that the positions, numbers and shapes of the first conductive structures 240, the second conductive structures 290 and the third conductive structures 350 are determined by design requirements and they are not limited thereto.

Afterwards, a dicing process (a singulation process) is performed along scribe lines (not shown) between the adjacent chip regions 130 so as to form multiple separated chip packages. In some embodiments, signals from the substrate 100 and the chip 250 are externally output through the first conductive structures 240 and the second conductive structures 290, respectively. Signals from other circuits (such as the power supply circuit or ground circuit) are transferred through the first conductive structures 240, the second conductive structures 290, and the third conductive structures 350.

According to the aforementioned embodiments, the sensing device and one or more integrated circuit devices are integrated into the same chip package. As a result, the size of the printed circuit board, which will be subsequently bonded with the chip package, can be reduced. Furthermore, the insulating layer covering the substrate and the chip is ground or polished and its thickness become as low as possible. The second conductive structures are small-size bonding balls or conductive pillars, instead of wires. The second conductive structures, which are exposed from the ground insulating layer, can directly construct external electrical connection paths. Therefore, the height of the chip package is reduced even further, and then the size of electronic products with a sensing function is reduced.

Figure 3:
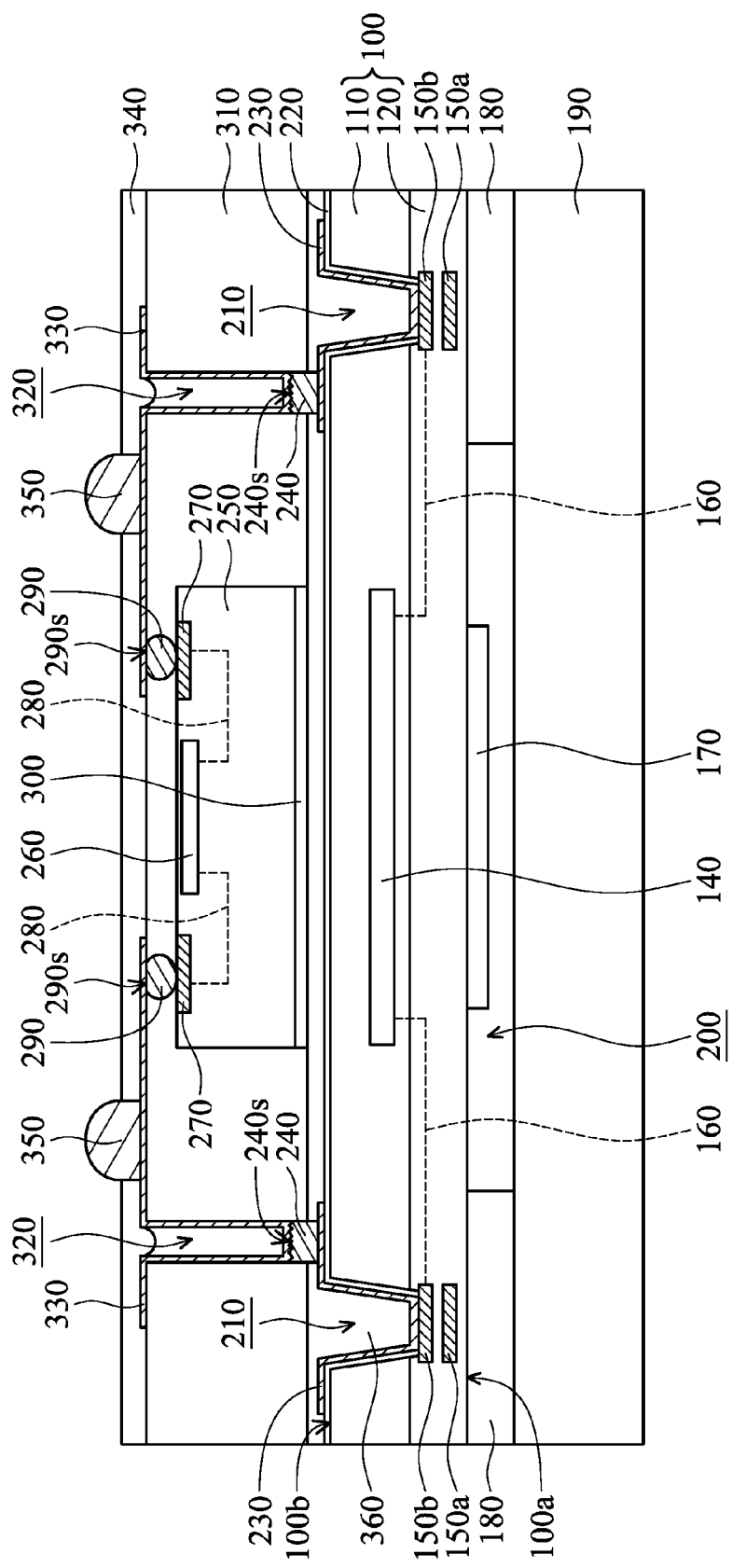
FIGS. 3 and 4 are cross-sectional views of other exemplary embodiments of a chip package according to the invention.

A cross-sectional view of another exemplary embodiment of a chip package according to the invention is illustrated in FIG. 3, wherein elements in FIG. 3 that are the same as those in FIGS. 1A to 1F and FIG. 2 are labeled with the same reference numbers as in FIGS. 1A to 1F and FIG. 2 and are not described again for brevity. Structure and forming methods of the chip package shown in FIG. 3 are similar to that shown in FIG. 1F and FIG. 2. The difference between them is that the first conductive structures 240 in FIG. 1F and FIG. 2 are bonding balls. The first conductive structures 240 in FIG. 3 are conductive pillars, and the chip package in FIG. 3 further comprises a protection layer 360.

In the embodiment of FIG. 3, after the formation of the patterned redistribution layer 230, the protection layer 360 may be formed on the redistribution layer 230 and the insulating layer 220 by a deposition process (such as a coating process, a physical vapor deposition process, a chemical vapor deposition process or another suitable process). In some embodiments, the openings 210 may be partially or completely filled with the protection layer 360. In some embodiments, the protection layer 360 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), a photoresist material or another suitable insulating material.

Afterwards, multiple openings may be formed in the protection layer 360 in each chip region 130 by lithography and etching processes so as to expose portions of the redistribution layer 230 on the insulating layer 220. In some embodiments, the protection layer 360 may comprise a photoresist material, and the openings may be formed in the protection layer 360 by a lithography process.

Next, an electroless plating process, a lithography process, and an plating process are sequentially performed to form the first conductive structures 240 in the openings of the protection layer 360. The first conductive structures 240 are in direct electrical contact with or indirectly electrically connected to the exposed redistribution layer 230. In this case, the first conductive structures 240 are pillars, and the first conductive structures 240 may comprise copper, or another suitable conductive material.

After the formation of the first conductive structures 240, the chip 250 with the second conductive structures 290 is attached on the protection layer 360. Processes that are similar to or the same as those shown in FIGS. 1D to 1F may be subsequently performed to complete the formation of the chip package shown in FIG. 3.

Figure 4:
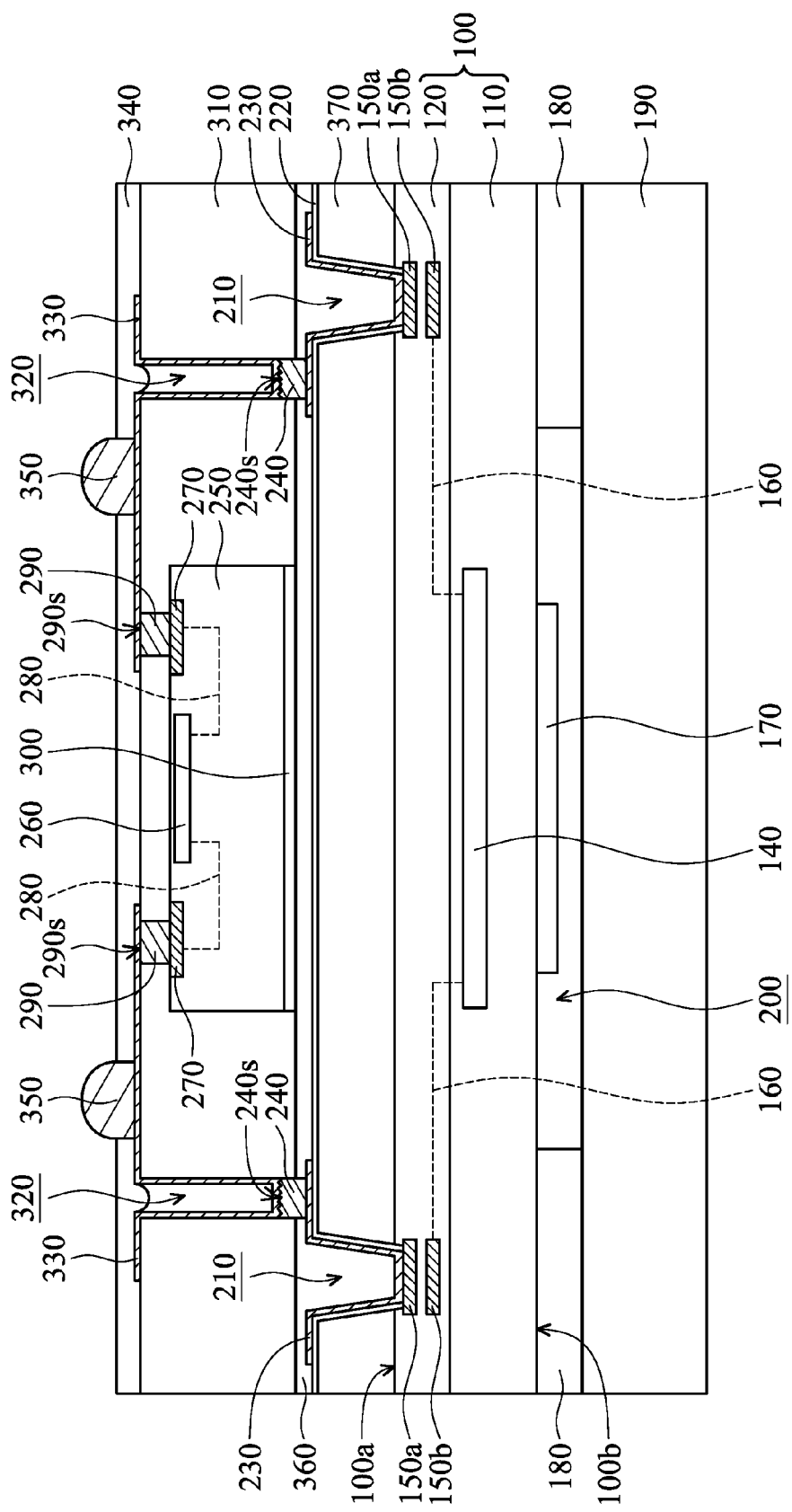

A cross-sectional view of yet another exemplary embodiment of a chip package according to the invention is illustrated in FIG. 4, wherein elements in FIG. 4 that are the same as those in FIGS. 1A to 1F and FIGS. 2 and 3 are labeled with the same reference numbers as in FIGS. 1A to 1F and FIGS. 2 and 3 and are not described again for brevity. Structure and forming methods of the chip package shown in FIG. 4 are similar to that shown in FIGS. 1F, 2 and 3.

Similar to the process shown in FIG. 1A, the substrate 100 is provided. Next, a carrier substrate 370 is provided on the first surface 100a of the substrate 100. The carrier substrate 370 may comprise silicon or another suitable supporting material.

Afterwards, a thinning process using the carrier substrate 370 as support is performed on the second surface 100b of the substrate 100. The optical element 170, the spacer layer 180, and the cover plate 190 are formed on the thinned second surface 100b.

Similar to the process shown in FIG. 1B, the openings 210 may be formed by a lithography process and an etching process. The openings 210 extend from the carrier substrate 370 towards the substrate 100. The openings 210 penetrate through the carrier substrate 370 and extend into the insulating layer 120 to expose top surfaces of the corresponding topmost conducting pad 150a.

Subsequently, the insulating layer 220 may be formed on the carrier substrate 370 by a deposition process. The insulating layer 220 conformally extends into the openings 210 of the carrier substrate 370, and covers the exposed topmost conducting pad 150a.

Similar to the process shown in FIG. 1C, the portions of the insulating layer 220 on the bottoms of the openings 210 are removed. As a result, the top surface of the topmost conducting pad 150a is exposed. Afterwards, the patterned redistribution layer 230 is formed on the insulating layer 220. The redistribution layer 230 is in direct electrical contact with or indirectly electrically connected to the exposed topmost conducting pad 150a through the openings 210.

Similar to the process shown in FIG. 3, the protection layer 360 is formed on the redistribution layer 230 and the insulating layer 220. Multiple openings are formed in the protection layer 360 so as to expose portions of the redistribution layer 230 on the insulating layer 220. Next, an electroless plating process, a lithography process, and an plating process are sequentially performed to form the first conductive structures 240 in the openings of the protection layer 360.

Similar to the process shown in FIG. 1D, an electroless plating process, a lithography process, and an etching process may be sequentially performed on the wafer to form the second conductive structures 290. A thinning process and a dicing process are sequentially performed on the wafer to form the chip 250. Afterwards, the chip 250 with the second conductive structures 290 is attached onto the protection layer 360. In some embodiments, the first conductive structures 240 and the second conductive structures 290 are conductive pillars. In some other embodiments, the first conductive structures 240 and/or the second conductive structures 290 are bonding balls.

Subsequently, the insulating layer 310 is formed on the carrier substrate 370 so as to cover the carrier substrate 370, the first conductive structures 240, the redistribution layer 230, the chip 250 and the second conductive structures 290. Processes that are similar to or the same as those shown in FIGS. 1E to 1F may be subsequently performed to complete the formation of the chip package shown in FIG. 4.

Figure 5A:
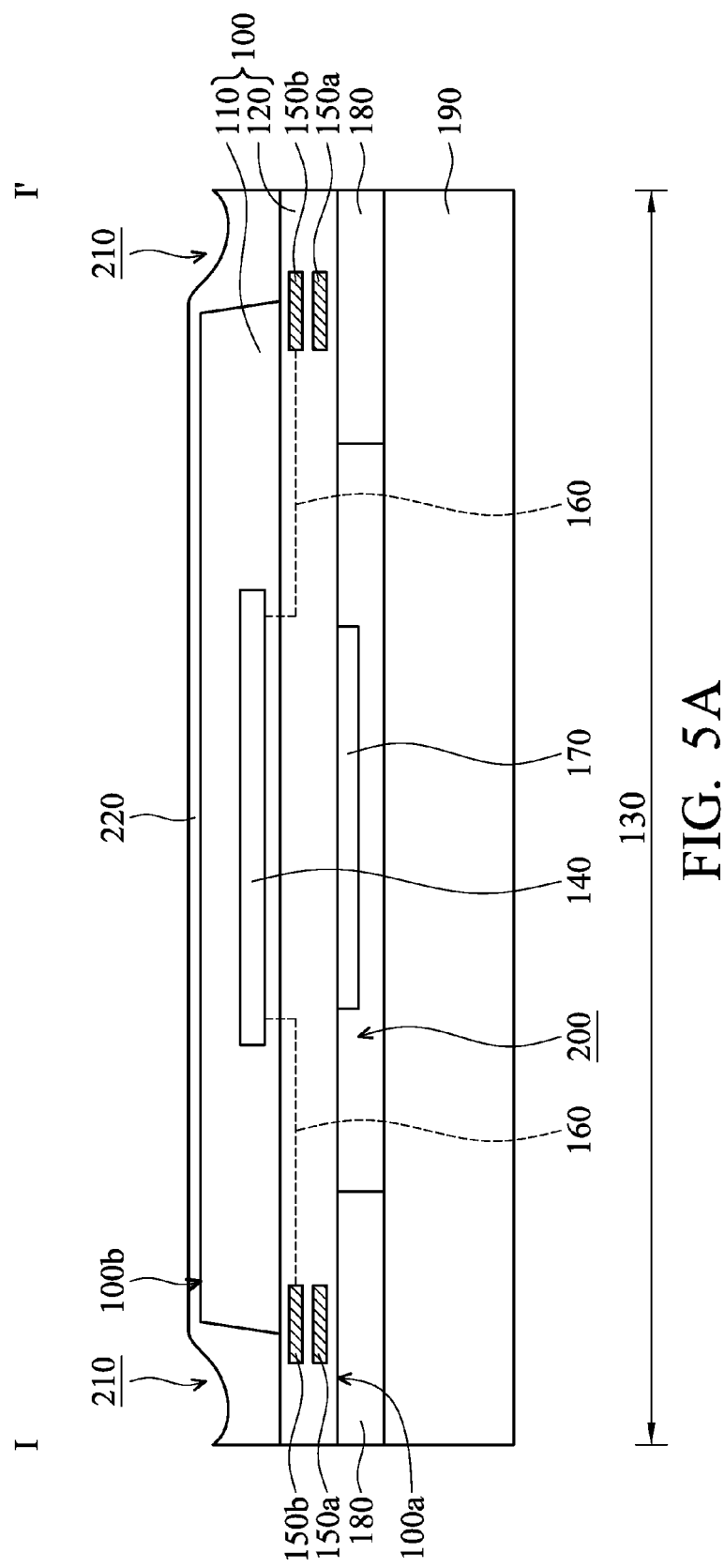
FIGS. 5A to 5D are cross-sectional views of another exemplary embodiment of a method for forming a chip package according to the invention.
Figure 5B:
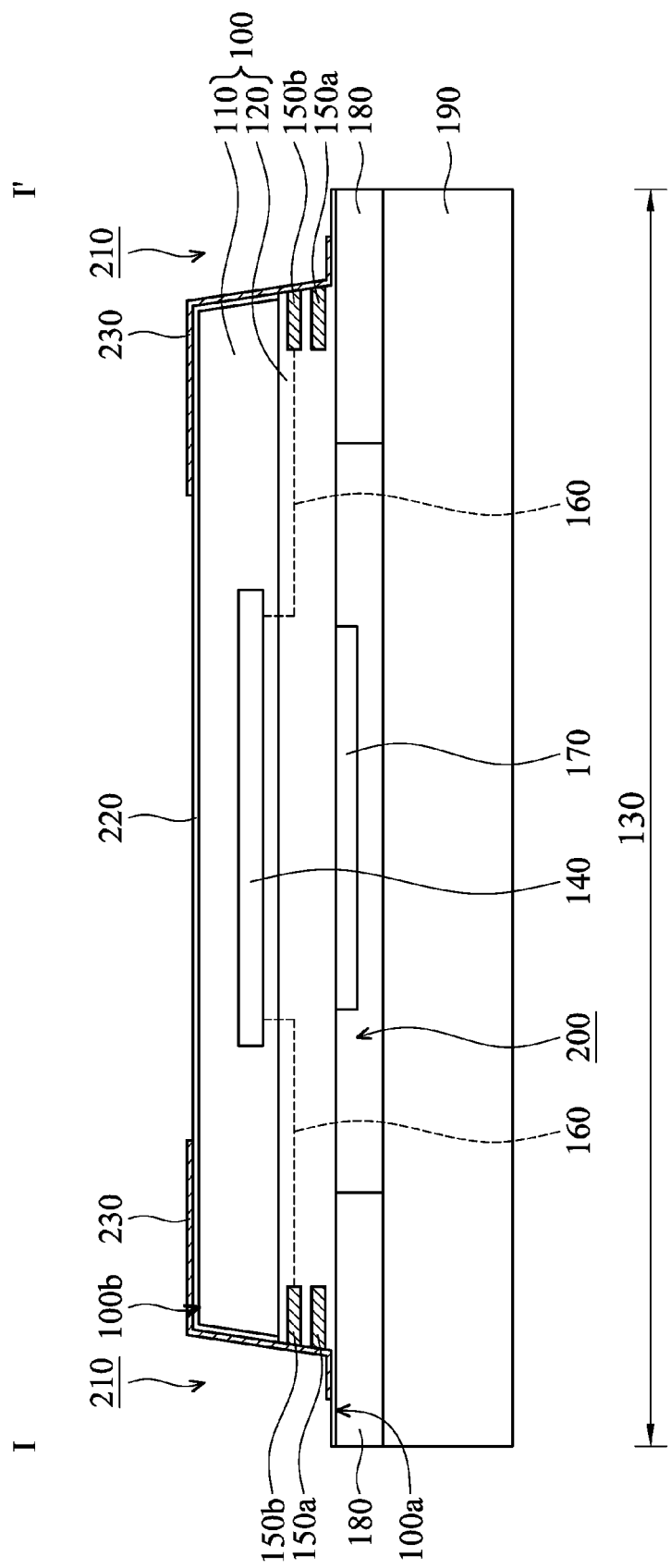
Figure 5C:
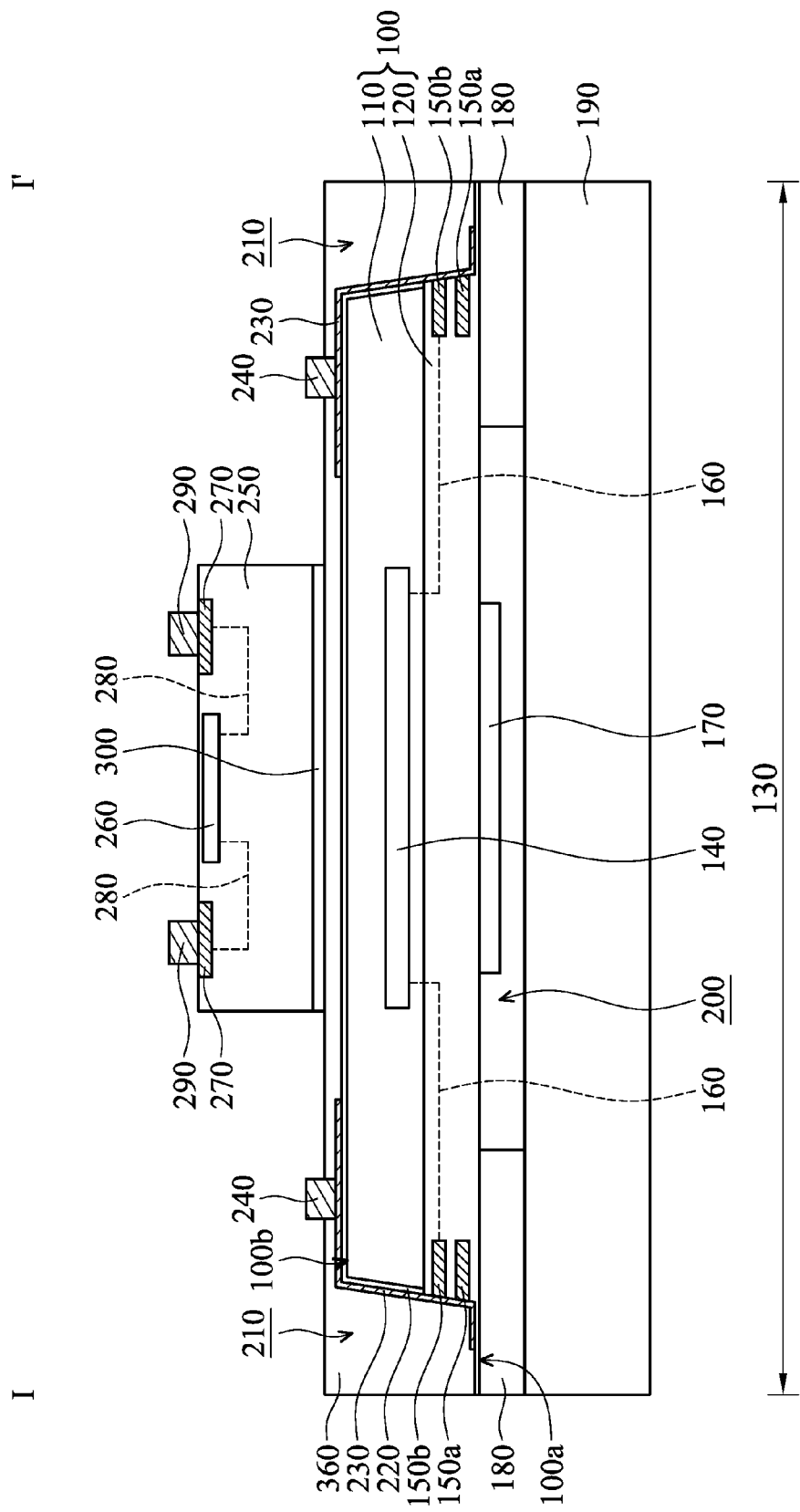
Figure 5D:
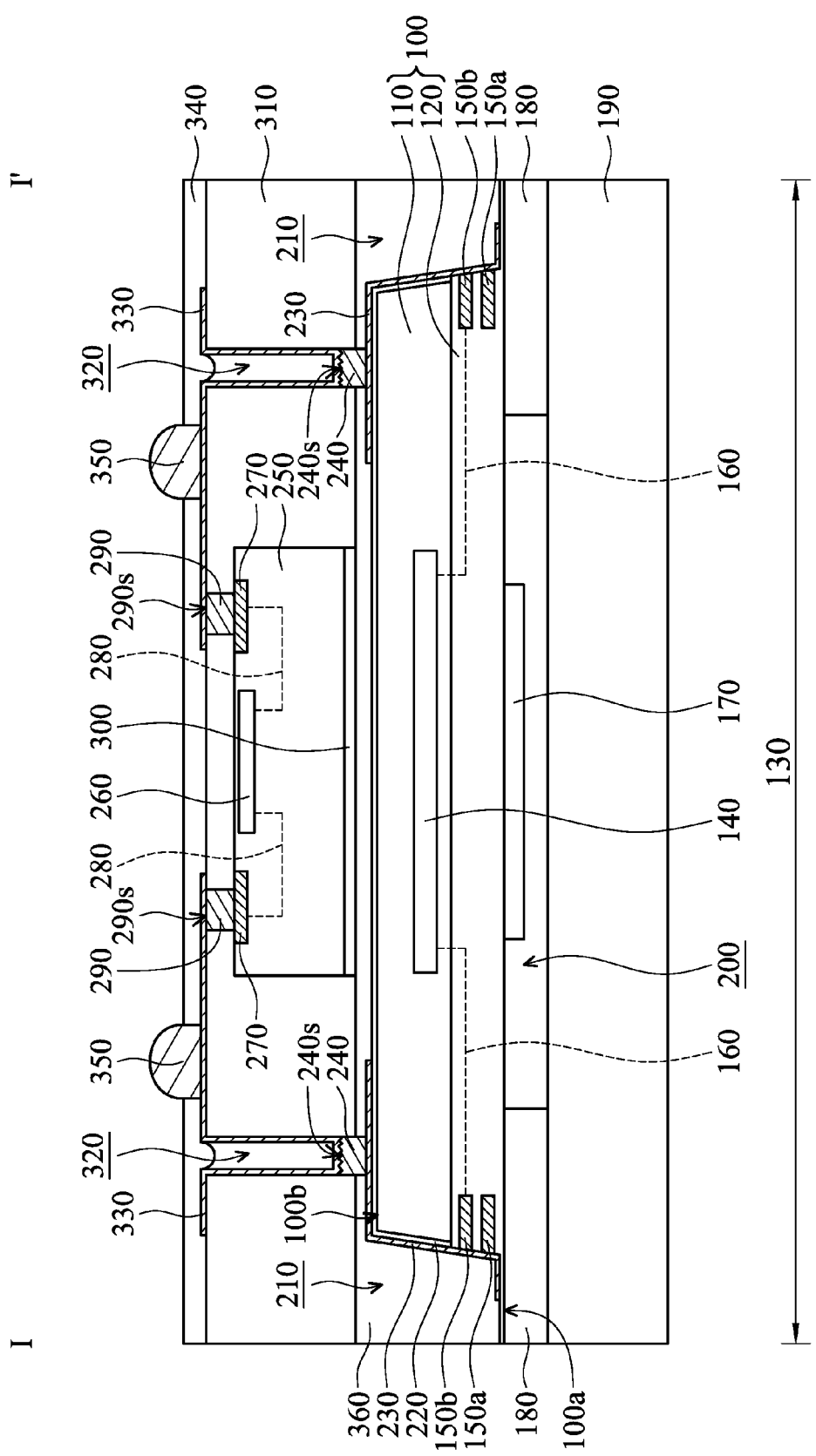
Figure 6:
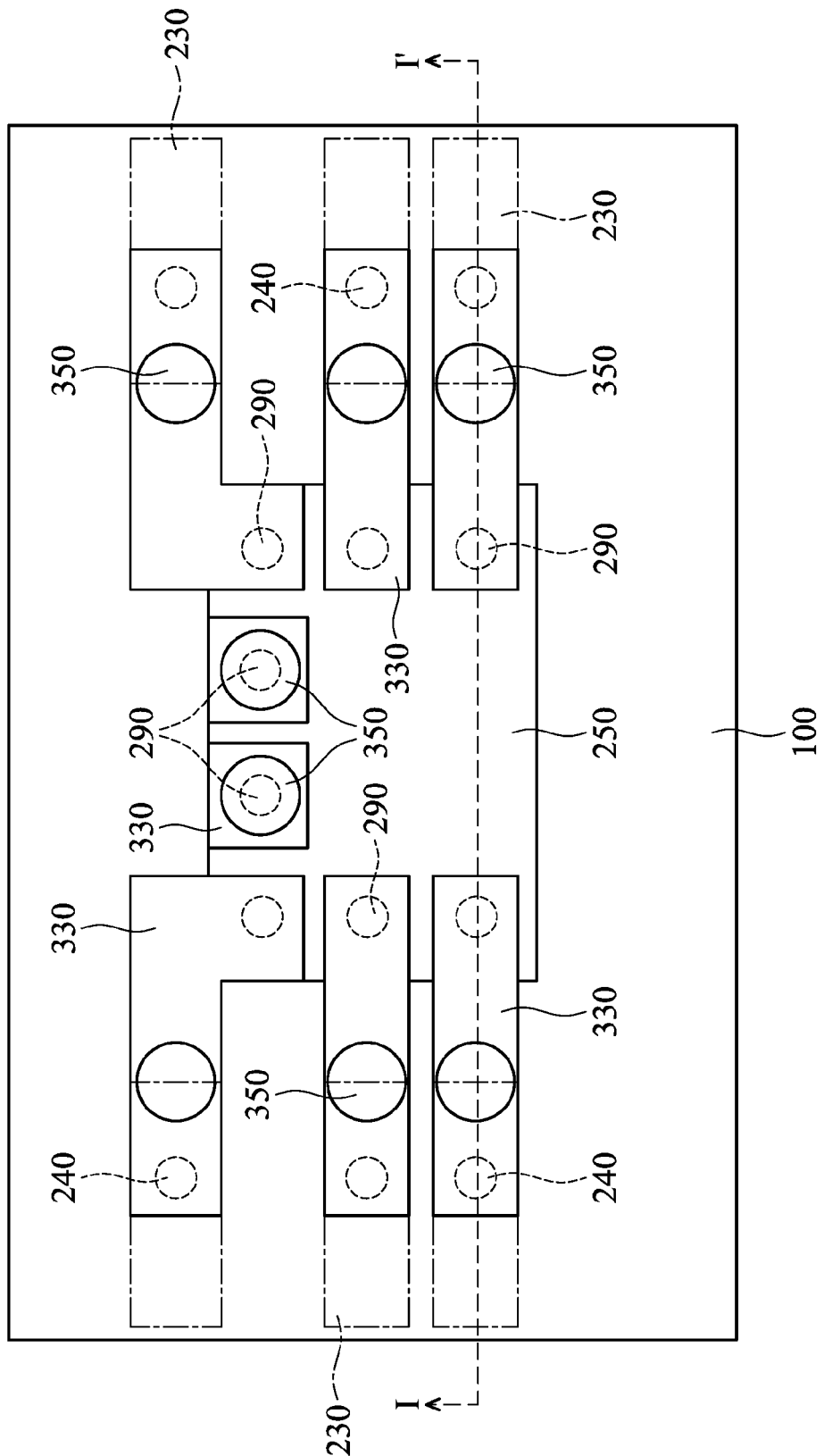
FIG. 6 is a top view of another exemplary embodiment of a chip package according to the invention.

Yet another exemplary embodiment of a method for forming a chip package according to the invention is illustrated in FIGS. 5A to 5D and FIG. 6, in which FIGS. 5A to 5D are cross-sectional views of yet another exemplary embodiment of a method for forming a chip package according to the invention, and FIG. 6 is a top view of yet another exemplary embodiment of a chip package according to the invention. Elements in FIGS. 5A to 5D and FIG. 6 that are the same as those in FIGS. 1A to 1F and FIGS. 2 to 4 are labeled with the same reference numbers as in FIGS. 1A to 1F and FIGS. 2 to 4 and are not described again for brevity.

Referring to FIG. 5A, similar to the process shown in FIG. 1A, the optical element 170 corresponding to the sensing device 140 is formed on the first surface 100a of the substrate 100. The cover plate 190 is attached on the first surface 100a of the substrate 100 through the spacer layer 180. A thinning process is performed on the second surface 100b of the substrate 100.

Afterwards, multiple openings 210 may be formed in the substrate 100 in each chip region 130 by a lithography process and an etching process (such as a dry etching process, a wet etching process, a plasma etching process, a reactive ion etching process, or another suitable process). The openings 210 extend from the second surface 100b towards the first surface 100a along edges of the chip regions 130. The openings 210 penetrate through the semiconductor substrate 110. The openings 210 expose the top surface of the insulating layer 120 without extending into the insulating layer 120.

Next, an insulating layer 220 may be formed on the second surface 100b of the substrate 100 by a deposition process (such as a coating process, a physical vapor deposition process, a chemical vapor deposition process or another suitable process). The insulating layer 220 completely fills the openings 210, and covers the exposed insulating layer 120.

Referring to FIG. 5B, portions of the insulating layer 220, the insulating layer 120, the topmost conducting pad 150a, and the bottommost conducting pad 150b, which are adjacent to the edges of the chip regions 130, may be removed by a notching process or another suitable process. As a result, the openings 210 extend into the insulating layer 120, and side surfaces of the topmost conducting pad 150a and the bottommost conducting pad 150b are exposed. In this case, portions of the semiconductor substrate 110 in the chip regions 130 are separated from each other. The sidewalls of the semiconductor substrate 110 remain covered by the insulating layer 220.

Afterwards, the patterned redistribution layer 230 may be formed on the insulating layer 220 by a deposition process and lithography and etching processes. The redistribution layer 230 is on the second surface 100b and conformally extends onto sidewalls and bottoms of the openings 210. The redistribution layer 230 is electrically isolated from the semiconductor substrate 110 by the insulating layer 220. The redistribution layer 230 may be in direct electrical contact with or indirectly electrically connected to the topmost conducting pad 150a and the bottommost conducting pad 150b through the openings 210. Accordingly, the redistribution layer 230 and the topmost conducting pad 150a (or the bottommost conducting pad 150b) form T-contacts (T-shape structure).

Referring to FIG. 5C, the protection layer 360 is formed on the redistribution layer 230 and the insulating layer 220. Multiple openings are formed in the protection layer 360 so as to expose portions of the redistribution layer 230 on the insulating layer 220. Next, an electroless plating process, a lithography process, and an plating process are sequentially performed to form the first conductive structures 240 in the openings of the protection layer 360.

Similar to the process shown in FIG. 3, an electroless plating process, a lithography process, and an etching process may be sequentially performed on the wafer to form the second conductive structures 290. A thinning process and a dicing process are sequentially performed on the wafer to form the chip 250. Afterwards, the chip 250 with the second conductive structures 290 is attached onto the protection layer 360.

Processes that are similar to or the same as those shown in FIGS. 1E to 1F may be subsequently performed to complete the formation of the chip package shown in FIG. 5D, wherein FIG. 5D is a cross-sectional view taken along line I-I' shown in FIG. 6. In some embodiments, the first conductive structures 240 and the second conductive structures 290 are conductive pillars. In some other embodiments, the first conductive structures 240 and/or the second conductive structures 290 are bonding balls.

In some embodiments, some of the third conductive structures 350 do not vertically overlap the chip 250. One of the third conductive structures 350 is located laterally between one of the first conductive structures 240 and one of the second conductive structures 290. Some of the third conductive structures 350 may be disposed directly above the second conductive structures 290. As a result, they vertically overlap some of the second conductive structures 290 and the chip 250. Also, a portion of the redistribution layer 330 is vertically sandwiched between one of the second conductive structures 290 and one of the third conductive structures 350. It should be realized that the positions, numbers and shapes of the first conductive structures 240, the second conductive structures 290 and the third conductive structures 350 are determined by design requirements and they are not limited thereto.

A sensing device and conducting pads in a chip package having a sensing function are typically located on an active surface of the chip package. It is necessary that the sensing device on the active surface is prevented from being shielded. Also, electrical connection paths cannot be constructed between the active surface and the opposite non-active surface by a wire bonding process. Accordingly, a chip package having a sensing function and another integrated circuit chip are separately and independently disposed on a printed circuit board, and are then electrically connected to each other through wires.

In various embodiments of the invention, the chip package mainly includes a sensing device 140. The first conductive structures 240 are disposed on the sensing device 140 and electrically connected to the sensing means 140. The chip 250 including an integrated circuit device 260 and the second conductive structures 290 are disposed on the sensing device 140. The second conductive structures 290 are located on the chip 250 and 260 and electrically connected to the integrated circuit device 260 and the first conductive structures 240. The insulating layer 310 covers the sensing device 140 and the chip 250, and the insulating layer 310 has holes 320. The first conductive structures 240 are positioned under the bottom of the holes 320. The top surface of the insulating layer 310 and the top surface 290s of the second conductive structures 290 are coplanar.

In some embodiments, as shown in FIGS. 1F, 3 and 5D, the sensing device 140 is located within the substrate 100. The first conductive structures 240 and the chip 250 are positioned on the substrate 100, and the insulating layer 310 covers the substrate 100. The redistribution layer 230 is positioned between the substrate 100 and the first conductive structures 240, and extends into the openings 210 to electrically connect the topmost conducting pad 150a and the bottommost conducting pad 150b. Therefore, the chip packages shown in FIGS. 1F, 3 and 5D have a front-side illuminated (FSI) image sensing device.

In some embodiments, as shown in FIG. 4, the carrier substrate 370 is located between the sensing device 140 and the chip 250. The first conductive structures 240 are located on the carrier substrate 370, and the insulating layer 310 covers the carrier substrate 370. The topmost conducting pad 150a and the bottommost conducting pad 150b are located between the sensing device 140 and the carrier substrate 370. The openings 310 penetrate through the carrier substrate 370 to expose the topmost conducting pad 150a and the bottommost conducting pad 150b. The redistribution layer 230 is positioned between the carrier substrate 370 and the first conductive structures 240, and extends into the openings 210 to electrically connect the topmost conducting pad 150a and the bottommost conducting pad 150b. Therefore, the chip packages shown in FIG. 4 has a back-side illuminated (BSI) image sensing device.

According to the aforementioned embodiments, external electrical connection paths of the substrate 100 are constructed by TSVs or T-contacts. Accordingly, the chip 250 can be disposed on the second surface 100b of the substrate 100 to avoid shielding the sensing device 140. Signals from the substrate 100 and the chip 250 can be output externally through the first conductive structures 240 and the second conductive structures 290. Signals from other circuits (such as the power supply circuit or ground circuit) can also be transferred through the first conductive structures 240, the second conductive structures 290 and the third conductive structures 350. Therefore, according to various embodiments, no matter whether a sensing device is a front-side or back-side illuminated image sensing device or another sensing device, it and one or more integrated circuit devices can be integrated into one chip package. As a result, the size of the printed circuit board, which will be subsequently bonded with the chip package, can be reduced. The size of electronic products with a sensing function is reduced even further. In addition, wafer-level chip scale packaging (CSP) technology is used to form chip packages. Massive chip packages can be fabricated, thereby reducing the fabrication cost and time even further.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
   forming a first conductive structure on a sensing device, wherein the first conductive structure is electrically connected to the sensing device;
   providing a chip and a second conductive structure on the sensing device, wherein the chip comprises an integrated circuit device, and wherein the second conductive structure is positioned on the chip and is electrically connected to the integrated circuit device and the first conductive structure; and
   forming an insulating layer to cover the sensing device and the chip, wherein the insulating layer has a hole, the first conductive structure is positioned under a bottom of the hole, the hole does not penetrate through the insulating layer, and the bottom of the hole is positioned within the insulating layer, and wherein a top surface of the insulating layer is coplanar with a top surface of the second conductive structure,
   wherein the sensing device is in a substrate, and the first conductive structure and the chip are on the substrate, and the insulating layer is formed to further cover the substrate, wherein the substrate comprises:
   a conducting pad adjacent to a first surface of the substrate and electrically connected to the sensing device; and
   an opening extending from a second surface of the substrate, which is opposite to the first surface, to expose the conducting pad, and
   wherein the method further comprises forming a redistribution layer between the substrate and the first conductive structure, wherein the redistribution layer extends into the opening to electrically connect the conducting pad.

2. The method as claimed in claim 1, wherein the top surface of the second conductive structure is flat.

3. The method as claimed in claim 1, wherein a top surface of the first conductive structure is uneven.

4. The method as claimed in claim 1, wherein the first conductive structure is a ball or pillar, and the second conductive structure is a ball or pillar.

5. The method as claimed in claim 1, further comprising:
   forming a redistribution layer on the insulating layer, wherein the redistribution layer on the insulating layer is electrically connected to the second conductive structure, and is further electrically connected to the first conductive structure through the hole; and forming a third conductive structure, wherein the third conductive structure is electrically connected to the redistribution layer on the insulating layer.

6. The method as claimed in claim 5, wherein a material of the third conductive structure is different from that of the first conductive structure and/or the second conductive structure.

7. The method as claimed in claim 5, wherein a size of the third conductive structure is greater than that of the first conductive structure and/or the second conductive structure.

8. The method as claimed in claim 5, wherein a process for forming the third conductive structure is different from that for forming the first conductive structure and/or the second conductive structure.

9. The method as claimed in claim 1, wherein the opening exposes a top surface or a side surface of the conducting pad.

10. The method as claimed in claim 1, wherein a laser drilling process is performed to form the hole in the insulating layer.

11. A method for forming a chip package, comprising:
forming a first conductive structure on a sensing device, wherein the first conductive structure is electrically connected to the sensing device;
providing a chip and a second conductive structure on the sensing device, wherein the chip comprises an integrated circuit device, and wherein the second conductive structure is positioned on the chip and is electrically connected to the integrated circuit device and the first conductive structure;
forming an insulating layer to cover the sensing device and the chip, wherein the insulating layer has a hole, the first conductive structure is positioned under a bottom of the hole, the hole does not penetrate through the insulating layer, and the bottom of the hole is positioned within the insulating layer, and wherein a grinding process is performed so that a top surface of the insulating layer is coplanar with a top surface of the second conductive structure.

12. A method for forming a chip package, comprising:
forming a first conductive structure on a sensing device, wherein the first conductive structure is electrically connected to the sensing device;
providing a chip and a second conductive structure on the sensing device, wherein the chip comprises an integrated circuit device, and wherein the second conductive structure is positioned on the chip and is electrically connected to the integrated circuit device and the first conductive structure;
forming an insulating layer to cover the sensing device and the chip, wherein the insulating layer has a hole, the first conductive structure is positioned under a bottom of the hole, the hole does not penetrate through the insulating layer, and the bottom of the hole is positioned within the insulating layer, and wherein a top surface of the insulating layer is coplanar with a top surface of the second conductive structure;
providing a substrate between the sensing device and the chip, wherein the first conductive structure is on the substrate, and the insulating layer is formed to further cover the substrate, and wherein the substrate comprises an opening;
forming a conducting pad between the sensing device and the substrate, wherein the conducting pad is electrically connected to the sensing device, and the opening penetrates through the substrate to expose the conducting pad; and
forming a redistribution layer between the substrate and the first conductive structure, wherein the redistribution layer extends into the opening to electrically connect the conducting pad.

13. The method as claimed in claim 12, wherein the opening exposes a top surface or a side surface of the conducting pad.

14. The method as claimed in claim 12, wherein the top surface of the second conductive structure is flat.

15. The method as claimed in claim 12, wherein a top surface of the first conductive structure is uneven.

16. The method as claimed in claim 12, wherein the first conductive structure is a ball or pillar, and the second conductive structure is a ball or pillar.

17. The method as claimed in claim 12, further comprising:
forming a redistribution layer on the insulating layer, wherein the redistribution layer on the insulating layer is electrically connected to the second conductive structure, and is further electrically connected to the first conductive structure through the hole; and
forming a third conductive structure, wherein the third conductive structure is electrically connected to the redistribution layer on the insulating layer.

18. The method as claimed in claim 17, wherein a material of the third conductive structure is different from that of the first conductive structure and/or the second conductive structure.

19. The method as claimed in claim 17, wherein a size of the third conductive structure is greater than that of the first conductive structure and/or the second conductive structure.

20. The method as claimed in claim 17, wherein a process for forming the third conductive structure is different from that for forming the first conductive structure and/or the second conductive structure.

* * * * *